United States Patent [19]
Perkins

[11] Patent Number: 5,767,662
[45] Date of Patent: Jun. 16, 1998

[54] AMPLIFIER HAVING SINGLE-ENDED INPUT AND DIFFERENTIAL OUTPUT AND METHOD FOR AMPLIFYING A SIGNAL

[75] Inventor: Geoffrey W. Perkins, Chandler, Ariz.

[73] Assignee: Motorola, Inc., Schaumburg, Ill.

[21] Appl. No.: 666,795

[22] Filed: Jun. 21, 1996

[51] Int. Cl.$^6$ ................................. H03F 3/30; H03G 3/30
[52] U.S. Cl. .................... 330/301; 330/278; 330/288
[58] Field of Search ............................ 330/275, 288, 330/301, 148, 278

[56] References Cited

U.S. PATENT DOCUMENTS

| | | | |
|---|---|---|---|
| 3,573,645 | 4/1971 | Wheatley, Jr. | 330/301 X |
| 4,001,706 | 1/1977 | Prins et al. | 330/301 X |
| 4,049,977 | 9/1977 | Radovsky | 330/288 X |
| 4,485,351 | 11/1984 | Schemmel et al. | 330/288 |
| 4,956,615 | 9/1990 | Böhme | 330/301 X |

OTHER PUBLICATIONS

Steven O. Smith, 1993 IEEE International Symposium on Circuits and Systems, "The Good, the Bad and the Ugly: Current Feedback—Technical Contributions and Limitations", Vol. 2 of 4, pp. 1058-1061.

Barry Harvey, 1993 IEEE International Symposium on Circuits and Systems, "Current Feedback Opamp Limitations: A State-of-the-Art Review", Vol. 2 of 4, pp. 1066-1069.

*Primary Examiner*—James B. Mullins
*Attorney, Agent, or Firm*—Gary Hoshizaki; Ziye Zhou

[57] ABSTRACT

An amplifier (40) includes a biasing element (59) which establishes a quiescent current in two transistors (62, 72). An input voltage signal is converted to an input current signal by a voltage to current converting element (65). The input current signal differentially modulates the currents in the two transistors (62, 72). The differentially modulated currents generates differentially modulated voltages across two diodes (76, 78). Two buffers (83, 87) generates a differential output voltage signal at two output terminals (77, 79) of the amplifier (40) by shifting the differentially modulated voltages across the two diodes (76, 78). The output signal of the amplifier (40) has a low DC offset. The gain of the amplifier (40) is adjusted by adjusting the quiescent current in the two transistors (62, 72).

16 Claims, 2 Drawing Sheets

AMPLIFIER HAVING SINGLE-ENDED INPUT AND DIFFERENTIAL OUTPUT AND METHOD FOR AMPLIFYING A SIGNAL

BACKGROUND OF THE INVENTION

The present invention relates, in general, to amplifiers and, more particularly, to amplifiers having differential outputs.

Amplifiers having differential outputs are widely used in electronic applications. For example, in a color television, a Gilbert multiplier is often used to form a variable gain input stage. The Gilbert multiplier functions as a variable gain chroma amplifier to differentially drive a chroma demodulator. Because of matching differences between individual transistors and resistors, direct current (DC) offsets can occur within normal manufacturing tolerances. The Gilbert multiplier usually operates with a DC bias current greater than fifty percent of the signal current to ensure linear operation of the Gilbert multiplier. Therefore, the DC offset can be a significant portion of the signal. When the Gilbert multiplier is called upon to deliver a high gain, the DC offset also increases. A large DC offset can cause distortion in the chroma demodulator which follows the variable gain input stage.

In low voltage applications, e.g., a circuit with a supply voltage of less than three volts, the amplitude of an input voltage signal sometimes exceeds the circuit supply voltage. A large input voltage signal can change the operating condition of the variable gain input stage and degrade its performance. Thus, the Gilbert multiplier operates properly as a chroma amplifier only when the amplitude of the input voltage signal is small compared with the supply voltage of the Gilbert multiplier.

Accordingly, it would be advantageous to have an amplifier having a differential output and a method for amplifying a signal. It is desirable for the differential output signal of the amplifier to have low DC offset. It is also desirable for the amplifier to be able to operate with a low supply voltage and a large input signal. It would be of further advantage to be able to control the gain of the amplifier.

DETAILED DESCRIPTION OF THE DRAWINGS

The present invention provides an amplifier having a differential output. The amplifiers includes a biasing circuit and an amplifying circuit. The biasing circuit generates two essentially identical quiescent currents in the amplifying circuit. An input voltage signal is converted to an input current signal with zero direct current (DC) offset. The input current signal differentially modulates the two quiescent currents in the amplifying circuit. A differential voltage signal having low DC offset is generated in accordance with the differentially modulated currents. The gain of the amplifier is adjustable by adjusting the two quiescent currents in the amplifying circuit. The conversion of the input voltage signal to the input current signal enables the amplifier to operate at a low supply voltage such as, for example, less than approximately three volts, and receiving a input voltage signal having a large peak to peak voltage swing such as, for example, more than two volts.

When the amplifier of the present invention is in an automatic gain control loop, the quiescent currents will decrease as the input signal decreases to increase the gain of the amplifier and will increase as the input signal increases to decrease the gain of the amplifier. Therefore, when the amplifier is called upon to deliver a high gain, the DC offset remains small. In the prior art Gilbert multiplier, the DC offset increases proportionally as the gain of the Gilbert multiplier increases.

Figure 1:
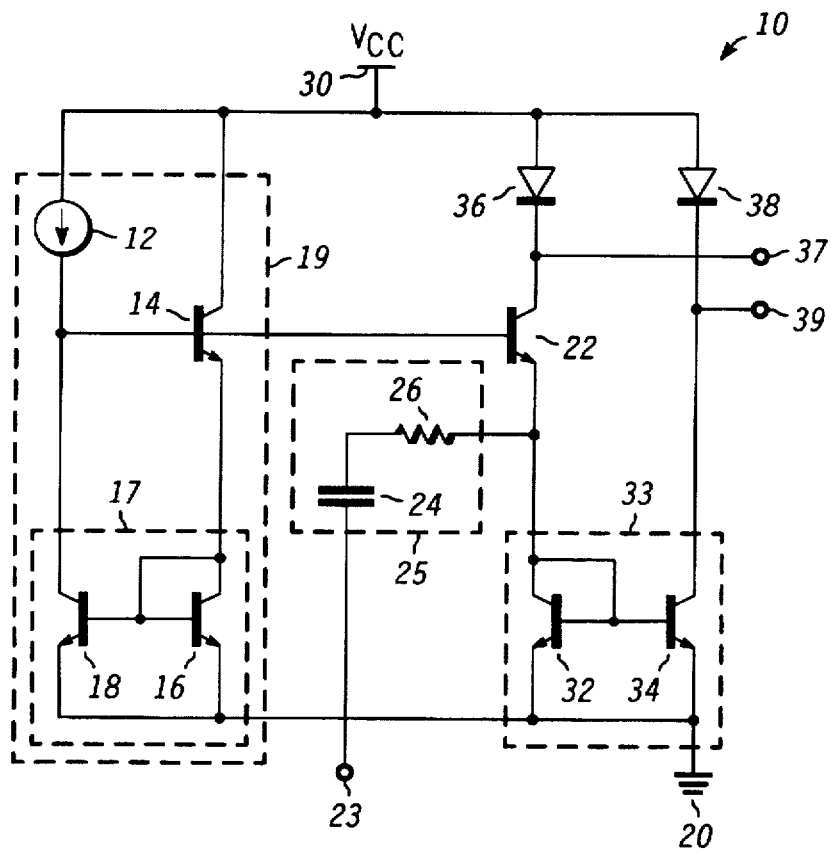
FIG. 1 is a schematic diagram of an amplifier in accordance with a first embodiment of the present invention.

FIG. 1 is a schematic diagram of an amplifier 10 in accordance with a first embodiment of the present invention. Amplifier 10 includes a current source 12 connected to a base electrode of an NPN bipolar transistor 14. An emitter electrode of transistor 14 is connected to a collector electrode and a base electrode of an NPN bipolar transistor 16. An emitter electrode of transistor 16 is connected to a conductor 20 for receiving a supply voltage such as, for example, a ground voltage. An NPN bipolar transistor 18 has a base electrode connected to the base electrode of transistor 16, an emitter electrode connected to the emitter electrode of transistor 16, and a collector electrode connected to the base electrode of transistor 14. Transistors 16 and 18 form a current mirror 17. The collector electrodes of transistors 16 and 18 serve as reference and current terminals, respectively, of current mirror 17. The emitter electrodes of transistors 16 and 18 form a common terminal of current mirror 17. A collector electrode of transistor 14 is connected to a conductor 30 for receiving a supply voltage of, for example, $V_{cc}$. Current source 12, transistor 14, and current mirror 17 form a voltage bias element 19 which provides a voltage bias to a base electrode of an NPN bipolar transistor 22. The base electrode of transistor 22 is connected to the base electrode of transistor 14.

An emitter electrode of transistor 22 is coupled to an input terminal 23 via a voltage to current converting element 25 for receiving an input signal of amplifier 10. Voltage to current converting element 25 includes a capacitor 24 and a resistor 26. Capacitor 24 has a first electrode connected to input terminal 23 and a second electrode connected to a first electrode of resistor 26. A second electrode of resistor 26 is connected to the emitter electrode of transistor 22. When a constant voltage is applied to input terminal 23, there is no current flowing in resistor 26. When the voltage at input terminal 23 is a function of time, a current is induced in resistor 26. Therefore, voltage to current converting element 25 converts an input voltage signal at input terminal 23 to an input current signal with zero DC offset.

The emitter electrode of transistor 22 is further connected to a collector electrode and a base electrode of an NPN bipolar transistor 32. An emitter electrode of transistor 32 is connected to conductor 20. An NPN bipolar transistor 34 has a base electrode connected to the base electrode of transistor 32 and an emitter electrode connected to the emitter electrode of transistor 32. Transistors 32 and 34 form a current mirror 33. The collector electrode of transistor 32 serves as a reference terminal of current mirror 33. A collector electrode of transistor 34 serves as a current terminal of current mirror 33. The emitter electrodes of transistors 32 and 34 form a common terminal of current mirror 33.

A collector electrode of transistor 22 is connected to a cathode of a diode 36. An anode of diode 36 is connected to conductor 30. A diode 38 has an anode connected to conductor 30 and a cathode connected to the collector electrode of transistor 34, i.e., the current terminal of current mirror 33. A first output terminal 37 is connected to the cathode of diode 36 for transmitting a first output signal of amplifier 10. Likewise, a second output terminal 39 is connected to the cathode of diode 38 for transmitting a second output signal of amplifier 10.

It should be understood that, although FIG. 1 shows transistors 14, 16, 18, 22, 32, and 34 as NPN bipolar transistors, this is not intended as a limitation of the present invention. Transistors 14, 16, 18, 22, 32, and 34 may be replaced with any transistors having control electrodes and current conducting electrodes such as, for example, PNP bipolar transistors, insulated gate field effect transistors, metal semiconductor field effect transistors, etc. As those skilled in the art are aware, for a bipolar transistor, the base electrode constitutes a control electrode, the emitter and collector electrodes constitute current conducting electrodes. Likewise, for a field effect transistor, the gate electrode constitutes a control electrode, the source and drain electrodes constitute current conducting electrodes. It should also be understood that current mirrors 17 and 33 are not limited to having the same structure as shown in FIG. 1. Current mirrors 17 and 33 may be replaced with any current mirrors having currents flowing out of their respective common terminals. Further, diodes 36 and 38 may be replaced with diode coupled transistors.

In operation, current source 12 generates a current which provides a base current of transistor 14 and a collector current of transistor 18. Typically, the base current of transistor 14 is significantly smaller than the collector current of transistor 18. Thus, the collector current of transistor 18 is approximately equal to the current generated by current source 12. The base current of transistor 14 generates a collector current of transistor 14. A collector current of transistor 16 is equal to the collector current of transistor 14. Because transistors 16 and 18 form current mirror 17, the collector current of transistor 18 is proportional to the collector current of transistor 16.

An increase in the base bias of transistor 14 causes the collector currents of transistors 14 and 16 to increase. The collector current of transistor 18 increases accordingly. When the collector current of transistor 18 is larger than the current generated by current source 12, the voltage difference across current source 12 increases, thereby decreasing the base bias of transistor 14. Therefore, current source 12, transistor 14, and current mirror 17 form a negative feedback loop to establish the base bias of transistor 14 at a substantially constant voltage level determined in accordance with the current generated by current source 12.

The base bias of transistor 14 established by current source 12, transistor 14, and current mirror 17 is applied to the base electrode of transistor 22. The base bias of transistor 22 generates a quiescent collector current in transistor 22. If the emitter areas of transistors 14, 16, 18, 22, and 32 are equal to each other, the quiescent collector current of transistor 22 is equal to the current of current source 12 and the collector currents of transistors 14, 16, and 18.

When there is no input signal at input terminal 23, the voltage at input terminal 23 is at a constant voltage level. The current flowing through resistor 26 is zero. A quiescent collector current flowing through transistor 32 is equal to the quiescent collector current of transistor 22. Because transistors 32 and 34 form current mirror 33, the collector current of transistor 34 is proportional to the quiescent collector current of transistor 32. More particularly, if the emitter areas of transistors 32 and 34 are equal to each other, the collector current of transistor 34 is approximately equal to the quiescent collector current of transistor 32. Because diode 36 has the same current path as transistor 22 and diode 38 has the same current path as transistor 34, the currents in diodes 36 and 38 are equal to each other. The voltage across diode 36 is equal to the voltage across diode 38. Therefore, the voltage difference across output terminals 37 and 39 is substantially zero. In other words, amplifier 10 generates a substantially zero differential output voltage signal when the voltage at input terminal 23 is constant.

When there is an input signal at input terminal 23, the voltage at input terminal 23 is a function of time. An input current signal is induced in resistor 26. The input current signal modulates the collector currents of transistors 22 and 32 differentially. A current flowing in resistor 26 in a direction from the electrode connected to capacitor 24 to the electrode connected to the emitter electrode of transistor 22 is referred to as a positive input signal swing or the input current signal having a positive polarity. A positive input signal swing decreases the collector current of transistor 22 and increases the collector current of transistor 32. Likewise, a current flowing in resistor 26 in a direction from the electrode connected to the emitter electrode of transistor 22 to the electrode connected to capacitor 24 is referred to as a negative input signal swing or the input current signal having a negative polarity. A negative input signal swing increases the collector current of transistor 22 and decreases the collector current of transistor 32. The value or magnitude of the input current signal determines the extent of modulation. The current modulation in transistor 22 is inversely proportional to the current modulation in transistor 32. If the collector current of transistor 22 is increased from the quiescent collector current by a ratio of, for example, two to one, the collector current of transistor 32 is decreased from the quiescent collector current by the same ratio of two to one. Because the currents flowing in diodes 36 and 38 are equal to the collector currents of transistors 22 and 32, respectively, the voltage across diodes 36 and 38 are also differentially modulated.

During a positive input signal swing, the current in diode 36 is smaller than the current in diode 38. The voltage across diode 36 is smaller than the voltage across diode 38. Thus, the voltage difference across output terminals 37 and 39 is positive in a sense that output terminal 37 is at a higher voltage level than output terminal 39. In other words, amplifier 10 generates a positive differential output voltage signal. Likewise, during a negative input signal swing, the current in diode 36 is larger than the current in diode 38. The voltage across diode 36 is higher than the voltage across diode 38. Thus, the voltage difference across output terminals 37 and 39 is negative in a sense that output terminal 37 is at a lower voltage level than output terminal 39. In other words, amplifier 10 generates a negative differential output voltage signal.

The gain of amplifier 10 is determined by the quiescent current flowing through transistors 22 and 32, which depends on the current of current source 12. The higher the quiescent current, the lower the gain of amplifier 10. Therefore, the gain of amplifier 10 is controllable by adjusting the current of current source 12. For example, the differential output signal of amplifier 10 is transmitted to a load (not shown in FIG. 1) of amplifier 10 such as, for example, a chroma demodulator, a phase detector, etc. An automatic gain control loop (not shown in FIG. 1) is established between amplifier 10 and its load to automatically adjust the current in current source 12 so that the output level of the load is at a constant level.

Figure 2:
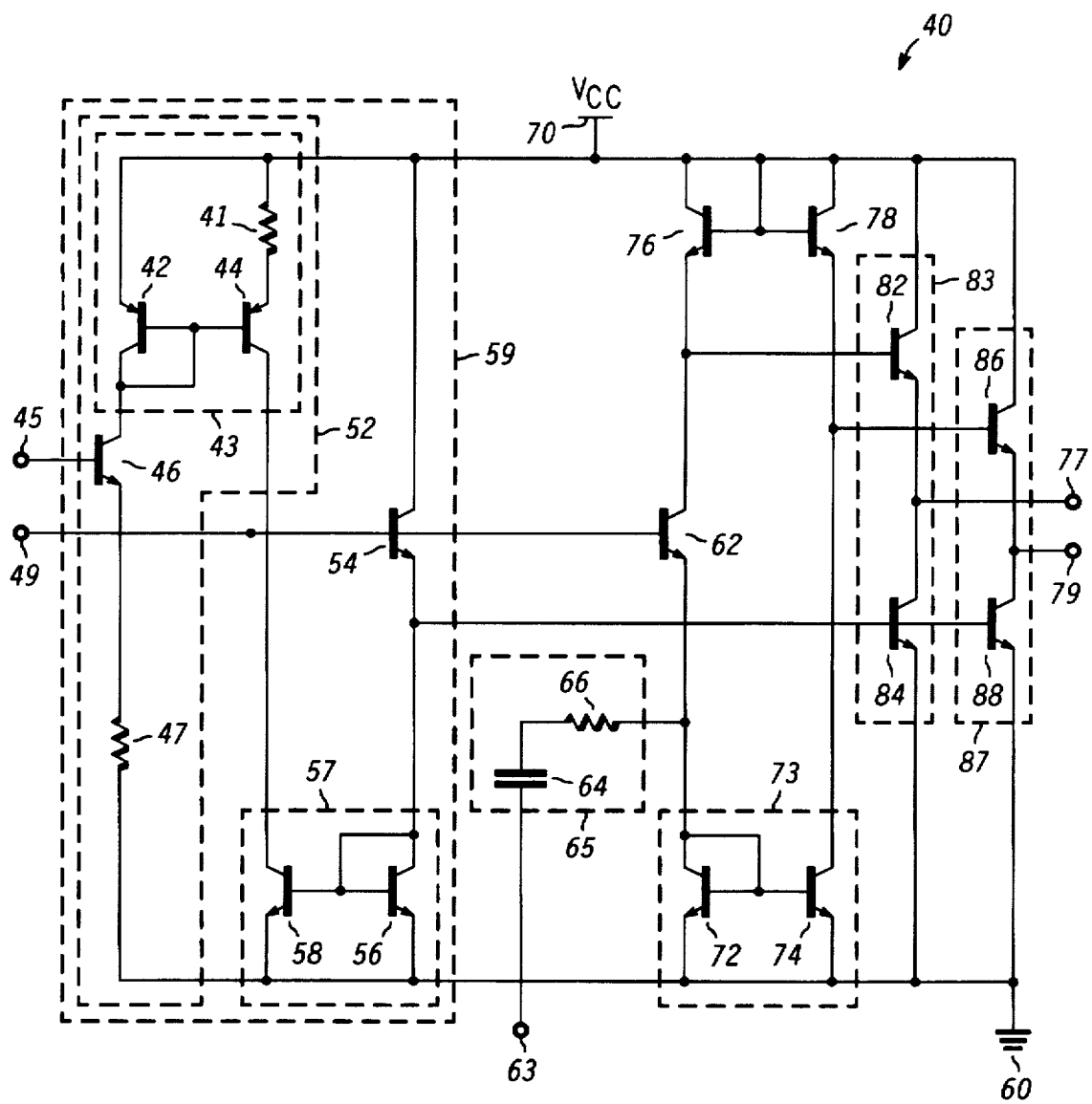
FIG. 2 is a schematic diagram of an amplifier in accordance with a second embodiment of the present invention.

FIG. 2 is a schematic diagram of an amplifier 40 in accordance with a second embodiment of the present invention. Amplifier 40 includes a current source 52 which includes resistors 41 and 47, PNP bipolar transistors 42 and 44, and an NPN bipolar transistor 46. Resistor 41 and transistors 42 and 44 form a current mirror 43. A first electrode of resistor 41 and an emitter electrode of transistor 42 are connected together to form a common terminal of current mirror 43, which is connected to a conductor 70 for receiving a supply voltage of, for example, $V_{cc}$. A second electrode of resistor 41 is connected to an emitter electrode of transistor 44. A base electrode and a collector electrode of transistor 42, and a base electrode of transistor 44 are connected together to form a reference terminal of current mirror 43. A collector electrode of transistor 44 serves as a current terminal of current mirror 43. The collector electrode of transistor 42 is further connected to a collector electrode of transistor 46. A base electrode of transistor 46 is connected to a voltage bias terminal 45 for receiving a voltage bias of, for example, $V_{cc}/2$. An emitter electrode of transistor 46 is connected to an electrode of resistor 47. Another electrode of resistor 47 is connected to a conductor 60 for receiving a supply voltage of, for example, a ground voltage. The collector electrode of transistor 44 is connected to a gain control terminal 49 for receiving a gain control current signal.

The collector electrode of transistor 44 is also connected to a base electrode of an NPN bipolar transistor 54. An emitter electrode of transistor 54 is connected to a collector electrode and a base electrode of an NPN bipolar transistor 56. An emitter electrode of transistor 56 is connected to conductor 60. An NPN bipolar transistor 58 has a base electrode connected to the base electrode of transistor 56, an emitter electrode connected to the emitter electrode of transistor 56, and a collector electrode connected to the base electrode of transistor 54. Transistors 56 and 58 form a current mirror 57. The collector electrodes of transistors 56 and 58 serve as reference and current terminals, respectively, of current mirror 57. The emitter electrodes of transistors 56 and 58 form a common terminal of current mirror 57. A collector electrode of transistor 54 is connected to conductor 70. Current source 52, transistor 54, and current mirror 57 form a voltage bias element 59 which provides a voltage bias to a base electrode of an NPN bipolar transistor 62. The base electrode of transistor 62 is connected to the base electrode of transistor 54.

An emitter electrode of transistor 62 is coupled to an input terminal 63 via a voltage to current converting element 65 for receiving an input signal of amplifier 40. Voltage to current converting element 65 includes a capacitor 64 and a resistor 66. Capacitor 64 has a first electrode connected to input terminal 63 and a second electrode connected to a first electrode of resistor 66. A second electrode of resistor 66 is connected to the emitter electrode of transistor 62. Like voltage to current converting element 25 in amplifier 10 of FIG. 1, voltage to current converting element 65 converts an input voltage signal at input terminal 63 to an input current signal with zero DC offset.

The emitter electrode of transistor 62 is also connected to a collector electrode and a base electrode of an NPN bipolar transistor 72. An emitter electrode of transistor 72 is connected to conductor 60. An NPN bipolar transistor 74 has a base electrode connected to the base electrode of transistor 72 and an emitter electrode connected to the emitter electrode of transistor 72. Transistors 72 and 74 form a current mirror 73. The collector electrode of transistor 72 serves as a reference terminal of current mirror 73. A collector electrode of transistor 74 serves as a current terminal of current mirror 73. The emitter electrodes of transistors 72 and 74 form a common terminal of current mirror 73.

A collector electrode of transistor 62 is connected to an emitter electrode of an NPN bipolar transistor 76. A base electrode and a collector electrode of transistor 76 are connected to conductor 70. An NPN bipolar transistor 78 has a base electrode and a collector electrode connected to conductor 70, and an emitter electrode connected to the collector electrode of transistor 74, i.e., the current terminal of current mirror 73. Transistors 76 and 78 are diode coupled and, therefore, function as two diodes. It is well know in the art that, for a diode coupled NPN bipolar transistor, the base and collector electrodes serve as an anode of a diode and the emitter electrode serves as a cathode of the diode.

Amplifier 40 further includes NPN bipolar transistors 82, 84, 86, and 88. Transistors 82 and 84 form an output buffer 83. Transistor 82 has a base electrode serving as an input of buffer 83 and connected to the emitter electrode of transistor 76, a collector electrode connected to conductor 70, and an emitter electrode serving as an output of buffer 83 and connected to a first output terminal 77 for transmitting a first output signal of amplifier 40. Transistor 84 has a collector electrode connected to the emitter electrode of transistor 82, a base electrode connected to the emitter electrode of transistor 54, and an emitter electrode connected to conductor 60. Likewise, transistors 86 and 88 form an output buffer 87. Transistor 86 has a base electrode serving as an input of buffer 87 and connected to the emitter electrode of transistor 78, a collector electrode connected to conductor 70, and an emitter electrode serving as an output of buffer 87 and connected to a second output terminal 79 for transmitting a second output signal of amplifier 40. Transistor 88 has a collector electrode connected to the emitter electrode of transistor 86, a base electrode connected to the emitter electrode of transistor 54, and an emitter electrode connected to conductor 60. Buffers 83 and 87 shift the voltage levels at their respective inputs by a specified value to produce the output voltage signals at output terminals 77 and 79, respectively. Preferably, transistors 82, 84, 86, and 88 are structurally substantially identical to each other. Thus, the voltage shift of buffer 83 is equal to the voltage shift of buffer 87. Furthermore, buffers 83 and 87 increase the load drive capability of amplifier 40.

It should be understood that, although FIG. 2 shows transistors 42, 44, 46, 54, 56, 58, 62, 72, 74, 76, 78, 82, 84, 86, and 88 as bipolar transistors, this is not intended as a limitation of the present invention. Transistors 42, 44, 46, 54, 56, 58, 62, 72, 74, 76, 78, 82, 84, 86, and 88 may be replaced by any transistors having control electrodes and current conducting electrodes such as, for example, insulated gate field effect transistors, metal semiconductor field effect transistors, etc. It should also be understood that current mirrors 43, 57, and 73 are not limited to having the same structure as shown in FIG. 2. Current mirror 43 may be replaced with any current mirror having current flowing into its common terminal. Current mirrors 57 and 73 may be replaced with any current mirrors having currents flowing out of their respective common terminals. Further, transistors 76 and 78 may be replaced with two diodes.

In operation, the voltage bias applied at voltage bias terminal 45 generates a collector current of transistor 46. The magnitude of the collector current of transistor 46 is determined by the voltage at the base electrode of transistor 46 and the resistance of resistor 47. The larger resistance of resistor 47, the smaller the collector current of transistor 46. The collector current of transistor 46 also flows through transistor 42. Because resistor 41 and transistors 42 and 44 form current mirror 43, the collector current of transistor 44 is proportional to the collector current of transistor 42, where the coefficient of proportionality is determined by the resistance of resistor 41 and the emitter area ratio of transistor 44 to transistor 42. A large resistance of resistor 41 and a small emitter area ratio of transistor 44 to transistor 42 results in a small coefficient of proportionality. Thus, the collector current of transistor 44 can be adjusted by, for example, adjusting the resistance of resistors 41, the resistance of resistor 47, or a combination of both. It should be noted that, although preferred, current source 52 is not limited to including both resistors 41 and 47. To achieve the same collector current of transistor 44, the resistance of resistor 47 in an embodiment which does not include resistor 41 is preferably larger than the resistance of resistor 47 in the embodiment shown in FIG. 2.

The collector current of transistor 44 is combined with the gain control current flowing via gain control terminal 49 to the node connected to the collector electrode of transistor 44 to provide an operating current of current source 52. When the gain control current is zero, the operating current of current source 52 has a minimum value equal to the collector current of transistor 44. Preferably, the minimum operating current of current source 52 provides a minimum quiescent current at which amplifier 40 operates properly as an amplifier.

The operating current of current source 52 provides a base current of transistor 54 and a collector current of transistor 58. Typically, the base current of transistor 54 is significantly smaller than the collector current of transistor 58. Thus, the collector current of transistor 58 is approximately equal to the operating current of current source 52. The base current of transistor 54 generates a collector current of transistor 54. A collector current of transistor 56 is equal to the collector current of transistor 54. Because transistors 56 and 58 form current mirror 57, the collector current of transistor 58 is proportional to the collector current of transistor 56.

An increase in the base bias of transistor 54 causes the collector currents of transistors 54 and 56 to increase. The collector current of transistor 58 increases accordingly. When the collector current of transistor 58 is larger than the operating current of current source 52, the voltage difference across resistor 41 and the emitter and collector electrodes of transistor 44 increases, thereby decreasing the base bias of transistor 54. Therefore, current source 52, transistors 54, and current mirror 57 form a negative feedback loop to establish the base bias of transistor 54 at a substantially constant voltage level determined in accordance with the operating current 00 current source 52.

The base bias of transistor 54 established by current source 52, transistor 54, and current mirror 57 is applied to the base electrode of transistor 62. The base bias of transistor 62 generates a quiescent collector current in transistor 62. If the emitter areas of transistors 54, 56, 58, 62, 72, 74, 76, and 78 are equal to each other, the quiescent collector current of transistor 62 is equal to the operating current of current source 52 and the collector currents of transistors 54, 56, and 58.

When there is no input signal at input terminal 63, the voltage at input terminal 63 is at a constant voltage level. The current flowing through resistor 66 is zero. A quiescent collector current flowing through transistor 72 is equal to the quiescent collector current of transistor 62. Because transistors 72 and 74 form current mirror 73, the collector current of transistor 74 is proportional to the quiescent collector current of transistor 72. More particularly, if the emitter areas of transistors 72 and 74 are equal to each other, the collector current of transistor 74 is approximately equal to the quiescent collector current of transistor 72. Because transistor 76 has the same current path as transistor 62 and transistor 78 has the same current path as transistor 74, the currents in diode coupled transistors 76 and 78 are equal to each other. The voltage across the base and emitter electrodes of transistor 76 is equal to the voltage across the base and emitter electrodes of transistor 78, i.e., the voltage difference between the emitter electrodes of transistors 76 and 78 is substantially zero.

The voltage at the emitter electrode of transistor 76 is applied to the base electrode of transistor 82 and establishes a collector current of transistor 82. Because the base bias of transistor 84 is constant, transistor 84 has a constant collector current and, therefore, functions as a current sink. The collector currents of transistors 82 and 84 cooperate to set up a voltage level at the emitter electrode of transistor 82. The voltage level at the emitter electrode of transistor 82 depends on the voltage level at the emitter electrode of transistor 76. Likewise, the voltage at the emitter electrode of transistor 78 is applied to the base electrode of transistor 86 and establishes a collector current of transistor 86. Because the base bias of transistor 88 is constant, transistor 88 has a constant collector current and, therefore, functions as a current sink. The collector currents of transistors 86 and 88 cooperate to set up a voltage level at the emitter electrode of transistor 86. The voltage level at the emitter electrode of transistor 86 depends on the voltage level at the emitter electrode of transistor 78. Because buffers 83 and 87 are identical to each other, the voltage difference between the emitter electrodes of transistors 82 and 86 is equal to the voltage difference between the emitter electrodes of transistors 76 and 78. Therefore, amplifier 40 generates a substantially zero differential output voltage signal across output terminals 77 and 79 when the voltage at input terminal 63 is constant.

When there is an input signal at input terminal 63, the voltage at input terminal 63 is a function of time. An input current signal is induced in resistor 66, which modulates the collector currents of transistors 62 and 72 differentially. A current flowing in resistor 66 in a direction from the electrode connected to capacitor 64 to the electrode connected to the emitter electrode of transistor 62 is referred to as a positive input signal swing. A positive input signal swing decreases the collector current of transistor 62 and increases the collector current of transistor 72. Likewise, a current flowing in resistor 66 in a direction from the electrode connected to the emitter electrode of transistor 62 to the electrode connected to capacitor 64 is referred to as a negative input signal swing. A negative input signal swing increases the collector current of transistor 62 and decreases the collector current of transistor 72. The value or magnitude of the input current signal determines the extent of modulation. The current modulation in transistor 62 is inversely proportional to the current modulation in transistor 72. If the collector current of transistor 62 is decreased from the quiescent collector current by a ratio of, for example, three to one, the collector current of transistor 72 is increased from the quiescent collector current by the same ratio of three to one. Because the collector currents of transistors 76 and 78 are equal to the collector currents of transistors 62 and 72, respectively, the voltage across diode coupled transistors 76 and 78 are also differentially modulated.

During a positive input signal swing, the current in transistor 76 is smaller than the current in transistor 78. The voltage across the base and emitter electrodes of transistor 76 is smaller than the voltage across the base and emitter electrodes of transistor 78. Thus, the voltage difference between the emitter electrodes of transistors 76 and 78 is positive in a sense that the emitter electrode of transistor 76 has a higher voltage level than the emitter electrode of transistor 78. As described hereinbefore, buffers 83 and 87 shift the voltage levels at the emitter electrodes of transistors 76 and 78, respectively, by an equal amount. In other words, the voltage difference between output terminals 77 and 79 is equal to the voltage difference between the emitter electrodes of transistors 76 and 78. Therefore, amplifier 40 generates a positive differential output voltage signal.

During a negative input signal swing, the current in transistor 76 is larger than the current in transistor 78. The voltage across the base and emitter electrodes of transistor 76 is larger than the voltage across the base and emitter electrodes of transistor 78. Thus, the voltage difference between the emitter electrodes of transistors 76 and 78 is negative in a sense that the emitter electrode of transistor 76 has a lower voltage level than the emitter electrode of transistor 78. As described hereinbefore, buffers 83 and 87 shift the voltage levels at the emitter electrodes of transistors 76 and 78, respectively, by an equal amount. Therefore, amplifier 40 generates a negative differential output voltage signal.

The gain of amplifier 40 is determined by the quiescent current flowing through transistors 62 and 72, which depends on the operating current of current source 52. The higher the quiescent current, the lower the gain of amplifier 40. The minimum quiescent current in transistors 62 and 72 is determined by collector current of transistor 44. The gain of amplifier 40 is adjusted by the gain control current flowing to the emitter of transistor 44 via gain control terminal 49. For example, the differential output signal of amplifier 40 is transmitted to a load (not shown in FIG. 2) of amplifier 40 such as, for example, a chroma demodulator, a phase detector, etc. An automatic gain control loop (not shown in FIG. 2) is established between amplifier 40 and its load to automatically adjust the gain control current so that the output level of the load is at a constant level.

Figure 3:
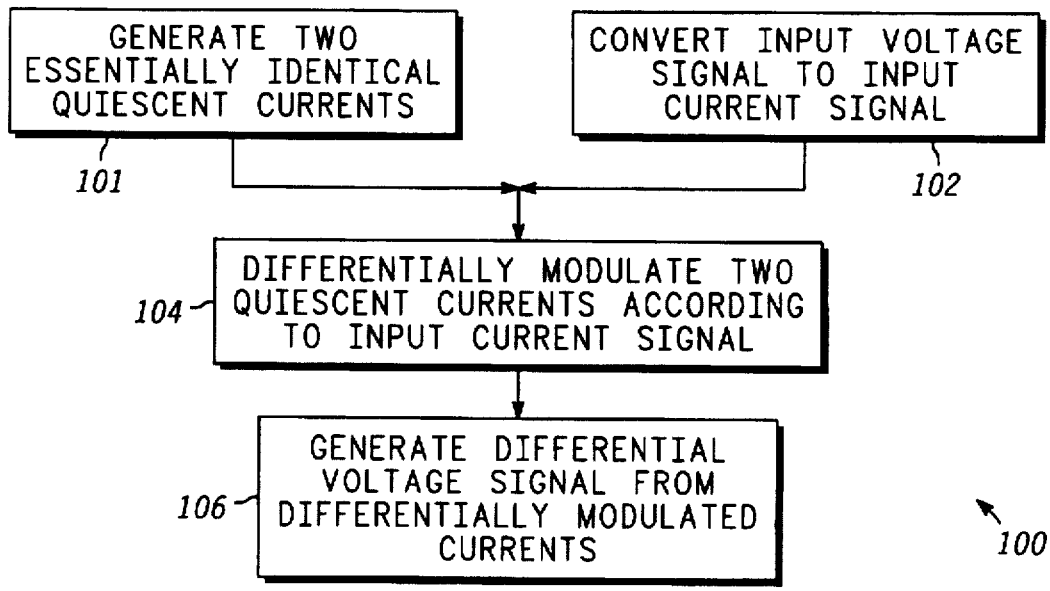
FIG. 3 is a flow chart of a method for amplifying a signal in accordance with the present invention.

FIG. 3 is a flow chart 100 of a method for amplifying a signal using an amplifier such as amplifier 10 of FIG. 1 and amplifier 40 of FIG. 2. The amplifier includes a biasing circuit and an amplifying circuit. The biasing circuit generates two quiescent current in the amplifying circuit (reference number 101). The two quiescent currents are substantially equal to each other. An input voltage signal is converted to an input current signal with zero DC offset using a voltage to current converting element in the amplifying circuit (reference number 102). The direction of the input current is referred to as the polarity of the input current signal. The input current signal differentially modulates the two quiescent currents generated in the amplifying circuit (reference number 104). When the input current signal has a first polarity, the first current is increased and the second current is decreased. When the input current signal has a second polarity which is opposite to the first polarity, the first current is decreased and the second current is increased. The modulation of the first quiescent current is inversely proportional to the modulation of the second quiescent current. More particularly, if the first current is increased from the quiescent current by a ratio of, for example, four to one in response to the input current signal, the second current is decreased by the same ratio of four to one. The two differentially modulated currents are used to generate two voltage levels A differential voltage signal is then generated by sensing the difference between the two voltage levels (reference number 106). When the two differentially modulated currents are equal to each other, the differential voltage signal is substantially zero. Thus, the output of the amplifier is a differential voltage signal with substantially zero DC offset. The gain of the amplifier is determined by the magnitude of the two quiescent currents. A feedback loop may be established between the amplifier and its load to adjust the quiescent currents, thereby adjusting the gain of the amplifier.

By now it should be appreciated that an amplifier and a method for amplifying a signal have been provided. In accordance with the present invention, an input voltage signal of the amplifier is converted to an input current signal with substantially zero DC offset. The input current signal differentially modulates two quiescent currents in the amplifier to generate a differential output signal with low DC offset. The gain of the amplifier is adjustable by adjusting the quiescent currents. The conversion of the input voltage signal to the input current signal enables the amplifier to operate at a low supply voltage such as, for example, less than approximately three volts.

While specific embodiments of the present invention have been shown and described, further modifications and improvements will occur to those skilled in the art. It is understood that the present invention is not limited to the particular forms shown and it is intended for the appended claims to cover all modifications of the invention which fall within the true spirit and scope of the invention. For example, voltage bias element 19 in amplifier 10 of FIG. 1 and voltage bias element 59 in amplifier 40 of FIG. 2 may be replaced with any biasing circuit with provides a substantially constant voltage bias.

I claim:

1. An amplifier comprising:
   a first transistor having a control electrode, a first current conducting electrode, and a second current conducting electrode;
   a first current mirror having a reference terminal coupled to the first current conducting electrode of said first transistor, a current terminal, and a common terminal coupled for receiving a first supply voltage;
   a first diode having an anode coupled for receiving a second supply voltage, and a cathode coupled to the second current conducting electrode of said first transistor;
   a second diode having an anode coupled to the anode of said first diode, and a cathode coupled to the current terminal of said first current mirror;
   a current source;
   a second transistor having a control electrode coupled to said current source and to the control electrode of said first transistor, a first current conducting electrode, and a second current conducting electrode coupled for receiving the second supply voltage; and
   a second current mirror having a reference terminal coupled to the first current conducting electrode of said second transistor, a current terminal coupled to the control electrode of said second transistor, and a common terminal coupled for receiving the first supply voltage.

2. The amplifier of claim 1, wherein the first current conducting electrode of said first transistor is coupled for receiving an input signal via a voltage to current converting element.

3. The amplifier of claim 2, said voltage to current converting element including:

a resistor having a first electrode coupled to the first current conducting electrode of said first transistor, and a second electrode; and a capacitor having a first electrode coupled to the second electrode of said resistor, and a second electrode coupled for receiving the input signal.

4. The amplifier of claim 1, wherein the cathode of said first diode is coupled for transmitting a first output signal of the amplifier via a first buffer and the cathode of said second diode is coupled for transmitting a second output signal of the amplifier via a second buffer.

5. The amplifier of claim 4, wherein said first buffer includes:

a third transistor having a control electrode coupled to the cathode of said first diode, a first current conducting electrode coupled for transmitting the first output signal, and a second current conducting electrode coupled to the anode of said first diode; and a current sink coupled to the first current conducting electrode of said third transistor.

6. The amplifier of claim 4, wherein said second buffer includes:

a third transistor having a control electrode coupled to the cathode of said second diode, a first current conducting electrode coupled for transmitting the second output signal, and a second current conducting electrode coupled to the anode of said second diode; and a fourth transistor having a control electrode coupled to the first current conducting electrode of said second transistor, a first current conducting electrode coupled for receiving the first supply voltage, and a second current conducting electrode coupled to the first current conducting electrode of said third transistor.

7. The amplifier of claim 1, wherein said current source includes:

a third transistor having a control electrode coupled for receiving a voltage bias, a first current conducting electrode, and a second current conducting electrode;

a third current mirror having a reference terminal coupled to the second current conducting electrode of said third transistor, a current terminal coupled to the control electrode of said second transistor, and a common terminal coupled for receiving the second supply voltage; and a first resistor having a first electrode coupled to the first current conducting electrode of said third transistor and a second electrode coupled for receiving the first supply voltage.

8. The amplifier of claim 7, wherein said third current mirror includes:

a fourth transistor having a control serving as the reference terminal of said third current mirror, a first current conducting electrode serving as the common terminal of said third current mirror, and a second current conducting electrode coupled to the control electrode of said fourth transistor;

a fifth transistor having a control electrode coupled to the control electrode of said fourth transistor, a first current conducting electrode, and a second current conducting electrode serving as the current terminal of said third current mirror; and a second resistor having a first electrode coupled to the first current conducting electrode of said fourth transistor and a second electrode coupled to the first current conducting electrode of said fifth transistor.

9. The amplifier of claim 7, wherein the current terminal of said third current mirror is further coupled for receiving a gain control current signal.

10. An amplifier, comprising:

a first transistor having a control electrode, a first current conducting electrode coupled for receiving an input signal, and a second current conducting electrode;

a second transistor having a control electrode coupled to the first current conducting electrode of said first transistor, a first current conducting electrode coupled for receiving a first supply voltage, and a second current conducting electrode coupled to the control electrode of said second transistor;

a third transistor having a control electrode coupled to the control electrode of said second transistor, a first current conducting electrode coupled to the first current conducting electrode of said second transistor, and a second current conducting electrode;

a fourth transistor having a control electrode coupled for receiving a second supply voltage, a first current conducting electrode coupled to the second current conducting electrode of said first transistor and coupled for transmitting a first output signal of the amplifier, and a second current conducting electrode coupled to the control electrode of said fourth transistor;

a fifth transistor having a control electrode coupled for receiving the second supply voltage, a first current conducting electrode coupled to the second current conducting electrode of said third transistor and coupled for transmitting a second output signal of the amplifier, and a second current conducting electrode coupled to the control electrode of said fifth transistor;

a current source;

a sixth transistor having a control electrode coupled to said current source and to the control electrode of said first transistor, a first current conducting electrode, and a second current conducting electrode coupled for receiving the second supply voltage; and a current mirror having a reference terminal coupled to the first current conducting electrode of said sixth transistor, a current terminal coupled to the control electrode of said sixth transistor, and a common terminal coupled for receiving the first supply voltage.

11. The amplifier of claim 10, wherein said first, second, third, fourth, and fifth transistors are NPN bipolar transistors having a first emitter area.

12. The amplifier of claim 10, wherein the first current conducting electrode of said first transistor is coupled for receiving the input signal via a voltage to current converting element, which includes:

a capacitor having a first electrode coupled for receiving the input signal, and a second electrode; and a resistor having a first electrode coupled to the second electrode of said capacitors, and a second electrode coupled to the first current conducting electrode of said first transistor.

13. The amplifier of claim 10, said current mirror including:

a seventh transistor having a control electrode coupled to the first current conducting electrode of said sixth transistor, a first current conducting electrode coupled for receiving the first supply voltage, and a second current conducting electrode coupled to the control electrode of said seventh transistor; and an eighth transistor having a control electrode coupled to the control electrode of said seventh transistor, a first current conducting electrode coupled to the first current conducting electrode of said seventh transistor, and a second current conducting electrode coupled to the control electrode of said sixth transistor.

14. The amplifier of claim 10, wherein:

the first current conducting electrode of said fourth transistor is coupled for transmitting the first output signal of the amplifier via a first buffer, which includes:

a seventh transistor having a control electrode coupled to the first current conducting electrode of said fourth transistor, a first current conducting electrode coupled for transmitting the first output signal, and a second current conducting electrode coupled to the control electrode of said fourth transistor; and an eighth transistor having a control electrode coupled to the first current conducting electrode of said sixth transistor, a first current conducting electrode coupled for receiving the first supply voltage, and a second current conducting electrode coupled to the first current conducting electrode of said seventh transistor; and the first current conducting electrode of said fifth transistor is coupled for transmitting the second output signal of the amplifier via a second buffer, which includes:

a ninth transistor having a control electrode coupled to the first current conducting electrode of said fifth transistor, a first current conducting electrode coupled for transmitting the second output signal, and a second current conducting electrode coupled to the control electrode of said fifth transistor; and a tenth transistor having a control electrode coupled to the first current conducting electrode of said sixth transistor, a first current conducting electrode coupled for receiving the first supply voltage, and a second current conducting electrode coupled to the first current conducting electrode of said ninth transistor.

15. The amplifier of claim 13, wherein said current source includes:

a ninth transistor having a control electrode coupled for receiving a voltage bias, a first current conducting electrode, and a second current conducting electrode;

a first resistor having a first electrode coupled to the first current conducting electrode of said ninth transistor and a second electrode coupled for receiving the first supply voltage;

a tenth transistor having a control electrode coupled to the second current conducting electrode of said ninth transistor, a first current conducting electrode coupled for receiving the second supply voltage, and a second current conducting electrode coupled to the control electrode of said tenth transistor;

an eleventh transistor having a control electrode coupled to the control electrode of said tenth transistor, a first current conducting electrode, and a second current conducting electrode coupled to the control electrode of said sixth transistor and coupled for receiving a gain control current signal; and a second resistor having a first electrode coupled to the first current conducting electrode of said tenth transistor, and a second electrode coupled to the first current conducting electrode of said eleventh transistor.

16. The amplifier of claim 15, wherein said sixth, seventh, eighth, and nineth transistors are NPN bipolar transistors, and said tenth and eleventh transistors are PNP bipolar transistors.

* * * * *